(12) United States Patent
Takaya

(10) Patent No.: US 8,927,974 B2
(45) Date of Patent: Jan. 6, 2015

(54) DISPLAY APPARATUS AND IMAGE PICKUP APPARATUS

(75) Inventor: Itaru Takaya, Chiba (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 13/595,805

(22) Filed: Aug. 27, 2012

(65) Prior Publication Data

US 2013/0048968 A1    Feb. 28, 2013

(30) Foreign Application Priority Data

Aug. 31, 2011  (JP) .................. 2011-188099

(51) Int. Cl.
- H01L 29/08 (2006.01)
- H01L 51/50 (2006.01)
- H01L 27/32 (2006.01)

(52) U.S. Cl.
CPC .......... H01L 27/3211 (2013.01); H01L 51/504 (2013.01); *H01L 2251/552* (2013.01)
USPC ........................................ 257/40

(58) Field of Classification Search
USPC ...................... 257/40, 89, 102, 103
See application file for complete search history.

(56) References Cited

U.S. PATENT DOCUMENTS

| | | | |
|---|---|---|---|
| 2007/0046185 A1* | 3/2007 | Kim | 313/504 |
| 2009/0296366 A1* | 12/2009 | Shikina et al. | 362/19 |
| 2011/0108810 A1* | 5/2011 | Kishino | 257/40 |

FOREIGN PATENT DOCUMENTS

| | | | |
|---|---|---|---|
| CN | 1921140 A | | 2/2007 |
| CN | 102082234 A | | 6/2011 |
| JP | 2007-066862 A | | 3/2007 |
| JP | 2007-179933 A | | 7/2007 |
| JP | 2007-234241 | * | 9/2007 |
| JP | 2007-234241 A | | 9/2007 |

OTHER PUBLICATIONS

Kazuki, Translation of JP2007-234241, Sep. 2007, pp. 1-14.*

* cited by examiner

*Primary Examiner* — Shaun Campbell

(74) *Attorney, Agent, or Firm* — Canon U.S.A., Inc. IP Division

(57) ABSTRACT

A first light-emitting layer of a first organic electroluminescent element is disposed in common to a second organic electroluminescent element, a second light-emitting layer of the second organic electroluminescent element is disposed in contact with the first light-emitting layer and in the cathode side, and the first light-emitting layer is a light-emitting layer having an electron trapping property.

9 Claims, 2 Drawing Sheets

DISPLAY APPARATUS AND IMAGE PICKUP APPARATUS

BACKGROUND OF THE INVENTION

1. Field of the Invention

The present invention relates to a display apparatus provided with an organic electroluminescent element.

2. Description of the Related Art

The organic electroluminescent element has a configuration in which an anode, a light-emitting layer containing an organic compound, and a cathode are stacked. Regarding a display apparatus including organic electroluminescent elements of three colors, red, green, and blue, a light-emitting layer of each color is vacuum-evaporated by using a metal mask for patterning in accordance with the pixel shape of the color concerned.

In recent years, each color pixel size has been reduced along with an improvement in accuracy of the display apparatus, and a high degree of accuracy has been required with respect to the metal mask for patterning in accordance with the pixel shape. Consequently, the proportion of the metal mask cost in the production cost of a display apparatus has increased and, thereby, production and maintenance of a metal mask have become difficult.

Japanese Patent Laid-Open No. 2007-066862 discloses a technology in which a blue light-emitting layer having a low luminous efficacy is disposed all over a pixel region and a red light-emitting layer and a green light-emitting layer are stacked in the side nearer to a take-out electrode than is a blue light-emitting layer. It is stated that the blue light-emitting layer having a low luminous efficacy is formed all over the pixel region to increase a blue pixel area and, thereby, the number of usage of the metal mask for patterning is reduced and the life of the display apparatus can be improved.

SUMMARY OF THE INVENTION

In the above-described configuration, regarding the red and the green light-emitting organic electroluminescent elements, each of the red light-emitting layer and the green light-emitting layer is disposed through stacking on the blue light-emitting layer. Therefore, it is necessary that only the red and the green light-emitting layers are allowed to emit light. However, in some cases, electrons pass through the red light-emitting layer and the green light-emitting layer depending on the configurations of the red light-emitting layer and the green light-emitting layer, the electrons are leaked to the blue light-emitting layer, the blue light-emitting layer is allowed to emit light and, thereby, it becomes difficult to allow the red light-emitting layer and the green light-emitting layer to emit light efficiently.

Furthermore, Japanese Patent Laid-Open No. 2007-066862 discloses that electron block layers may be disposed between the red light-emitting layer and the blue light-emitting layer and between the green light-emitting layer and the blue light-emitting layer. However, regarding this configuration, the drive voltage of the element increases.

Aspects of the present invention provide a display apparatus including a light-emitting layer disposed in common to organic electroluminescent elements to emit different colors, wherein the individual organic electroluminescent elements are allowed to emit light efficiently without disposing an electron block layer between light-emitting layers.

A display apparatus according to aspects of the present invention includes a first organic electroluminescent element to emit a first color and a second organic electroluminescent element to emit a second color different from the above-described first color, the above-described organic electroluminescent element being provided with an anode, a cathode, and a light-emitting layer disposed between the above-described anode and the above-described cathode, wherein a first light-emitting layer of the above-described first organic electroluminescent element is disposed in common to the above-described second organic electroluminescent element, a second light-emitting layer of the above-described second organic electroluminescent element is disposed in contact with the above-described first light-emitting layer and in the side nearer to the above-described cathode than is the above-described first light-emitting layer, and the above-described first light-emitting layer contains a host material and a light-emitting dopant material and is configured to satisfy Formulae (1) and (2) described below, $$|LUMO_{D1}| > |LUMO_{H1}| \quad (1)$$

$$|LUMO_{D1}| - |LUMO_{H1}| > |HOMO_{H1}| - |HOMO_{D1}| \quad (2)$$

where $LUMO_{H1}$ and $HOMO_{H1}$ represent the LUMO level energy and the HOMO level energy, respectively, of the above-described host material contained in the above-described first light-emitting layer and $LUMO_{D1}$ and $HOMO_{D1}$ represent the LUMO level energy and the HOMO level energy, respectively, of the above-described light-emitting dopant material contained in the above-described first light-emitting layer.

According to aspects of the present invention, regarding a display apparatus including a light-emitting layer disposed in common to organic electroluminescent elements to emit different colors, the individual organic electroluminescent elements are allowed to emit light efficiently without disposing an electron block layer between light-emitting layers.

Further features of the present invention will become apparent from the following description of exemplary embodiments with reference to the attached drawings.

DESCRIPTION OF THE EMBODIMENTS

Figure 1A:
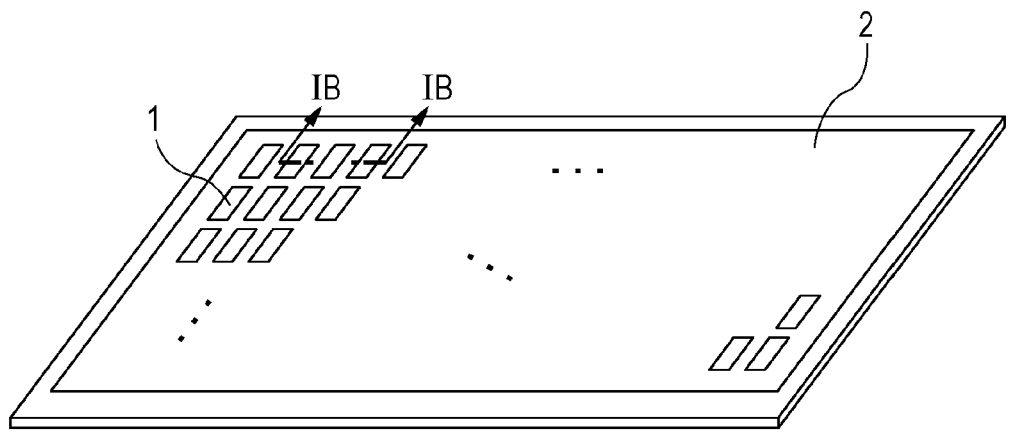
FIGS. 1A and 1B are diagrams schematically showing the configuration of a display apparatus according to an embodiment of the present invention.

A display apparatus according to aspects of the present invention will be described below on the basis of embodiments with reference to the drawings. Regarding the portions not specifically shown in the drawings or described in the present specification, well-known or publicly known technologies in the related art are applied. The embodiments explained below are no more than examples, and the present invention is not limited to them.

In particular, in the following embodiments, a first color, a second color, and a third color are specified to be green, red, and blue, respectively. A first organic electroluminescent element, a second organic electroluminescent element, and a third organic electroluminescent element are specified to be a green organic electroluminescent element, a red organic electroluminescent element, and a blue organic electroluminescent element. A first light-emitting layer, a second light-emitting layer, and a third light-emitting layer are specified to be a green light-emitting layer, a red light-emitting layer, and a blue light-emitting layer, respectively. However, the present invention is not limited to this configuration.

FIG. 1A is a schematic perspective diagram showing the configuration of a display apparatus according to an embodiment of the present invention. The display apparatus according to aspects of the present invention includes a plurality of pixels 1 provided with an organic electroluminescent element. The plurality of pixels 1 are arranged in the matrix, so as to constitute a display region 2. In this regard, the pixel refers to a region corresponding to a light-emitting region of one organic electroluminescent element. In the display apparatus according to the present embodiment, one color of organic electroluminescent element is disposed in each pixel 1. Each organic electroluminescent element emits any one of red light, green light, and blue light. Organic electroluminescent elements, each emitting any one of yellow, cyan, and white, may be included besides these three colors of organic electroluminescent elements. In the display apparatus according to the present embodiment, a plurality of pixel units formed from a plurality of pixels having different emission colors (for example, a pixel to emit red, a pixel to emit green, and a pixel to emit blue) are arranged. The pixel unit refers to a minimum unit which can emit a predetermined color through color mixing of the individual pixels.

Figure 1B:
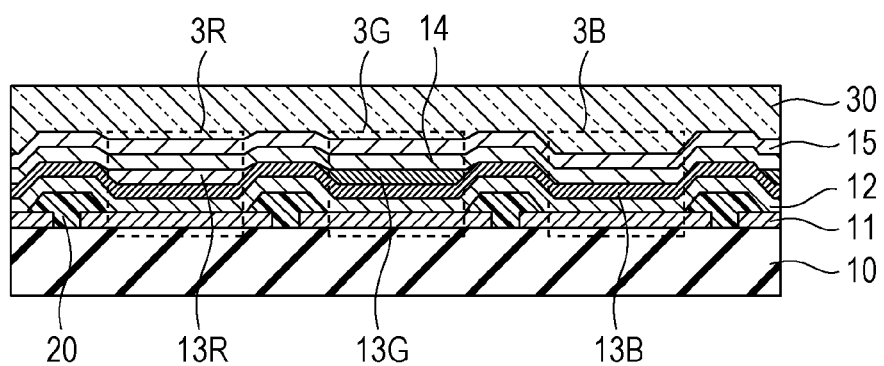

FIG. 1B is a schematic partial sectional diagram along a line IB-IB shown in FIG. 1A. Each pixel 1 includes an organic electroluminescent element provided with an anode 11, a hole transportation layer 12, a light-emitting layer containing an organic compound, an electron transportation layer 14, and a cathode 15 on a substrate 10. In this regard, 3R, 3G and 3B represent a red light-emitting organic electroluminescent element, a green light-emitting organic electroluminescent element, and a blue light-emitting organic electroluminescent element, respectively. The red, green, and blue light-emitting organic electroluminescent elements 3R, 3G, and 3B include a red light-emitting layer 13R, a green light-emitting layer 13G, and a blue light-emitting layer 13B, respectively. The blue light-emitting layer 13B is disposed over the red light-emitting organic electroluminescent element 3R and the green light-emitting organic electroluminescent element 3G and, therefore, the blue light-emitting layer 13B serves as a so-called common light-emitting layer. That is, each of the red light-emitting organic electroluminescent element 3R and the green light-emitting organic electroluminescent element 3G includes a blue light-emitting layer 13B having the same composition and the same film thickness as those of the blue light-emitting layer 13B in the blue light-emitting organic electroluminescent element 3B.

Furthermore, the red light-emitting layer 13R is disposed in contact with the blue light-emitting layer 13B and in the cathode 15 side of the blue light-emitting layer 13B. The green light-emitting layer 13G is disposed in contact with the blue light-emitting layer 13B and in the cathode 15 side of the blue light-emitting layer 13B. That is, in the configuration, an electron block layer is not disposed between the red light-emitting layer 13R and the blue light-emitting layer 13B nor between the green light-emitting layer 13G and the blue light-emitting layer 13B.

The individual organic electroluminescent elements are sealed with a seal film 30 in such a way that external oxygen and moisture do not enter.

As for seal film 30, an inorganic material, e.g., silicon nitride, silicon oxide, or aluminum oxide, may be used. The seal film may be formed from a stacked film of at least two layers of inorganic materials or be formed from a stacked film of an inorganic material and a resin material.

Any configuration to seal the organic electroluminescent element may be employed. Regarding the configuration, in place of the seal film 30, a seal cap made from glass, plastic, or the like may be disposed. The seal cap may be formed from, for example, a tabular member, e.g., a glass plate, and a sealing agent disposed around the display region 2 in order to bond the member and the substrate 10. A gas, e.g., nitrogen or argon, may be sealed into a space between the seal cap and the cathode 15 of the organic electroluminescent element, or the space may be filled with a resin material, e.g., an acrylic resin.

The blue light-emitting layer 13B is formed without using a metal mask for separate coating and the red light-emitting layer 13R and the green light-emitting layer 13G are formed into the shape of pixels by using metal masks for separate coating. In the case where the blue light-emitting layer 13B is formed without using a metal mask for separate coating, as described above, the number of usage of the metal mask for separate coating can be reduced as compared with the case where separate coating is employed with respect to the light-emitting layers of all colors.

The anode 11 is disposed separately from the anodes 11 of adjacent pixels (organic electroluminescent elements), and a pixel isolation layer 20 is disposed between pixels (more concretely, anodes 11) in order to prevent an occurrence of short-circuit with the cathode 15 due to a foreign substance. The hole transportation layer 12, the electron transportation layer 14, and the cathode 15 may be disposed in common to the adjacent pixels, as shown in FIG. 1B, or be disposed on a pixel basis through patterning.

In the present embodiment, the anode 11 is a reflection electrode and the cathode 15 is a transparent light-emission side electrode. As for the anode 11, stacking of a metal layer and a transparent electrically conductive layer may be employed. A hole transportation layer made from an organic compound may be disposed on the above-described anode 11. An electron injection layer may be disposed on the electron transportation layer 14.

As for the hole transportation layer, previously known materials, e.g., arylamines, may be used. The hole transportation layer may be formed by stacking different materials, e.g., a hole injection layer material, and in order to increase the efficiency of taking out of light, optical interference may be adjusted by changing the film thickness on a color basis through separate coating.

The usage of the metal mask for separate coating may be reduced by stacking the red light-emitting layer 13R and the green light-emitting layer 13G in the side of the anode 11, which serves as the reflection electrode, of the blue light-emitting layer 13B. However, the optical interference is not adjusted favorably. Therefore, in aspects of the present invention, the red light-emitting layer 13R and the green light-emitting layer 13G are disposed in the side of the cathode 15, which serves as the light-emission side electrode, of the blue light-emitting layer 13B.

A laminate of the hole transportation layer 12, the light-emitting layers 13R, 13G, and 13B, the electron transportation layer 14, and the hole injection layer and the electron injection layer used as necessary is referred to as an organic compound layer.

As described above, aspects of the present invention provide a display apparatus formed from organic electroluminescent elements 3R, 3G, and 3B of three colors, red, green, and blue, in which the anode 11, the organic compound layer containing the light-emitting layers 13R, 13G, and 13B, and the cathode 15 are stacked in that order. The blue light-emitting layer 13B is disposed all over the pixel region and the red and the green light-emitting layers 13R and 13G are disposed in contact with the blue light-emitting layer 13B and in the cathode 15 side.

In order to allow the red organic electroluminescent element 3R and the blue organic electroluminescent element 3B to emit light efficiently even in the configuration in which an electron block layer is not disposed between the two light-emitting layers 13 stacked, the configurations of the blue light-emitting layer 13B is devised. That is, the blue light-emitting layer 13B contains a host material and a light-emitting dopant material and is configured to satisfy Formulae (1) and (2) described below, $$|LUMO_{D1}| > |LUMO_{H1}| \quad (1)$$

$$|LUMO_{D1}| - |LUMO_{H1}| > |HOMO_{H1}| - |HOMO_{D1}| \quad (2).$$

Here, $LUMO_{H1}$ and $HOMO_{H1}$ represent the lowest unoccupied molecular orbital (LUMO) level energy and the highest occupied molecular orbital (HOMO) level energy, respectively, of the host material contained in the blue light-emitting layer 13B, and $LUMO_{D1}$ and $HOMO_{D1}$ represent the LUMO level energy and the HOMO level energy, respectively, of the light-emitting dopant material contained in the blue light-emitting layer 13B.

In general, if the concentration of the light emitting dopant material contained in the blue light-emitting layer is more than 10 percent by mass, reduction in luminous efficacy called concentration quenching occurs. Therefore, in aspects of the present invention, the concentration of the light emitting dopant material of the blue light-emitting layer 13B is specified to be 10 percent by weight or less.

Figure 2A:
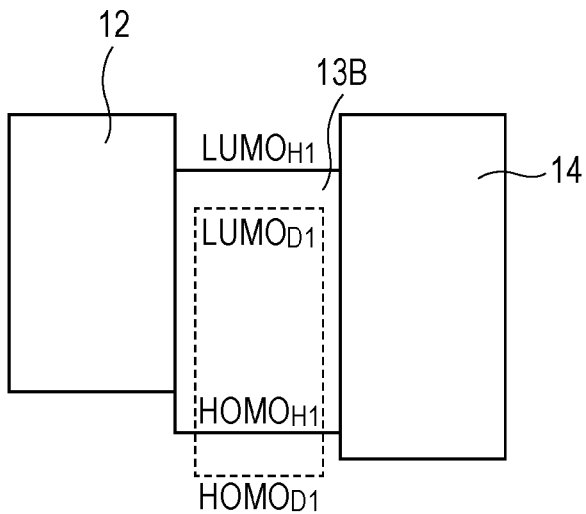
FIGS. 2A to 2C are typical energy band diagrams of blue light-emitting, red light-emitting, and green light-emitting organic electroluminescent elements of a display apparatus according to the present invention.

FIG. 2A shows an energy band diagram of the blue light-emitting organic electroluminescent element 3B. When electrons are injected into the blue light-emitting layer 13B satisfying Formulae (1) and (2), electrons are trapped at the LUMO level of the light-emitting dopant material. The light-emitting dopant material is 10 percent or less of the total mass of the blue light-emitting layer 13B, so that electrons are not conducted easily.

When holes are injected, holes are injected at the HOMO level of the host material. The host material constitutes the largest portion of the volume of the blue light-emitting layer 13B and, therefore, conducts this level. Consequently, the blue light-emitting layer 13B has the hole transportation property (electron trapping property) which conducts holes rather than electrons easily.

Formula (2) described above includes that the relationship $|HOMO_{H1}| > |HOMO_{D1}|$ may hold. In this case, holes are trapped at the HOMO level of the light-emitting dopant material easily. However, Formula (2) described above represents that the energy difference $|LUMO_{D1}| - |LUMO_{H1}|$ representing the strength of electron trapping of the light-emitting dopant material is larger than the energy difference $|HOMO_{H1}| - |HOMO_{D1}|$ representing the strength of hole trapping. Consequently, in the blue light-emitting layers 13B, electrons are not conducted easily and the holes move easily, so that the hole transportation property (electron trapping property) is exhibited. It may be the case that the blue light-emitting layer 13B is configured to satisfy $|HOMO_{D1}| > |HOMO_{H1}|$. According to this configuration, holes are conducted more easily. That is, in particular, Formula (3) described below can be satisfied.

$$|HOMO_{D1}| > |HOMO_{H1}| > |LUMO_{D1}| > |LUMO_{H1}| \quad (3)$$

As for the host material of the blue light-emitting layer 13B, pyrene derivatives and the like are used favorably. As for the light-emitting dopant material, fluoranthene derivatives and the like are used favorably.

Figure 2B:
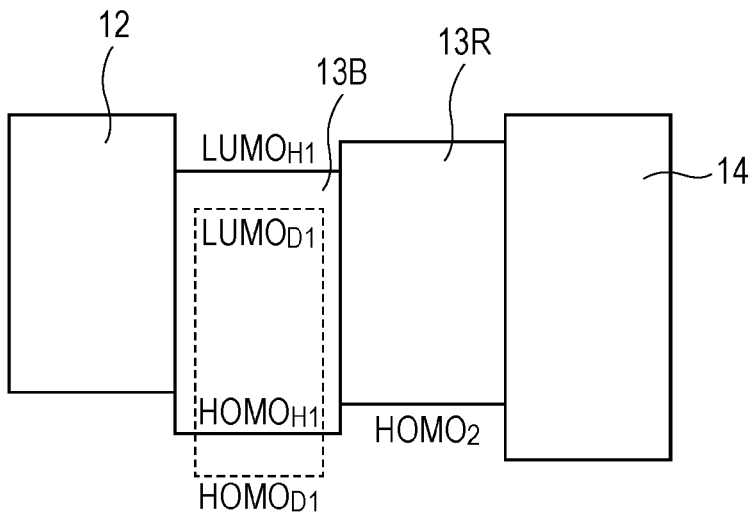
Figure 2C:
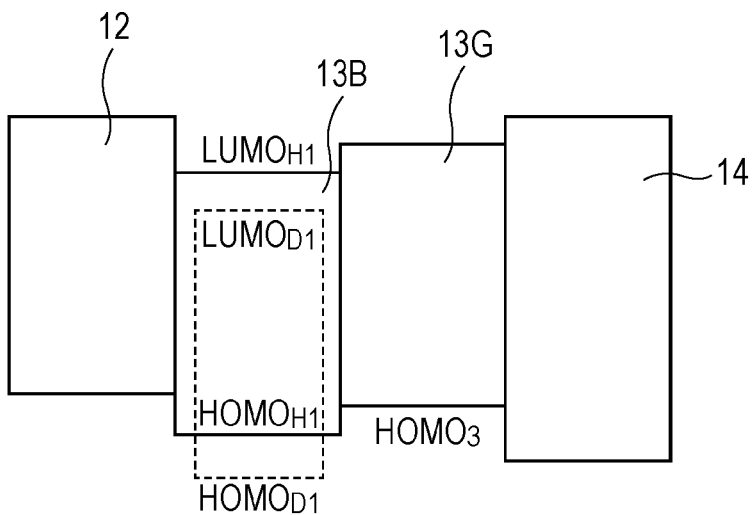

FIGS. 2B and 2C show typical energy band diagrams of red light-emitting and green light-emitting organic electroluminescent elements 3R and 3G, respectively. FIGS. 2B and 2C are favorable energy band structures, although the energy band structures of the red and green light-emitting layers 13R and 13G are not necessarily limited to them.

In the case where the red light-emitting layer 13R or green light-emitting layer 13G is stacked in the cathode 15 side while being in contact with the blue light-emitting layer 13B satisfying Formulae (1), (2), and (3) and having the hole transportation property, holes pass through the blue light-emitting layer 13B easily. Consequently, it is possible that light emission of the blue light-emitting layer 13B is suppressed and only the red and the green light-emitting layers 13R and 13G are allowed to emit light without increasing the voltages of the red and green light-emitting organic electroluminescent elements 3R and 3G.

Furthermore, regarding the red and the green organic light-emitting electroluminescent elements 3R and 3G, light emission of the blue light-emitting layer 13B is suppressed and, thereby, the electron block layer is not necessarily used. Regarding blue light-emitting organic electroluminescent element 3B as well, electron injection is not suppressed, and an increase in voltage is not brought about. Moreover, injection of electrons into the blue light-emitting layer 13B is not prevented and, therefore, the possibility of recombination in the blue light-emitting layer 13B is improved. Consequently, a problem does not occur in that the efficiency is reduced because holes pass through the blue light-emitting layer 13B.

The red light-emitting layer 13R and the green light-emitting layer 13G can be configured in such a way that the HOMO level energy $HOMO_2$ and the above-described $HOMO_{H1}$ of the red light-emitting layer 13R satisfy $$|HOMO_2| < |HOMO_{H1}| \quad (4)$$

and the HOMO level energy $HOMO_3$ and the above-described $HOMO_{H1}$ of the green light-emitting layer 13G satisfy $$|HOMO_3| < |HOMO_{H1}| \quad (5).$$

Here, regarding the above-described $HOMO_2$ ($HOMO_3$), in the case where the red light-emitting layer 13R (green light-emitting layer 13G) is made from only a light-emitting material, the HOMO level energy of the red light-emitting layer 13R (green light-emitting layer 13G) refers to the HOMO level energy of the light-emitting material concerned. In the case where the red light-emitting layer 13R (green light-emitting layer 13G) contains a host material and a light-emitting dopant material, the above-described $HOMO_2$ ($HOMO_3$) may be the HOMO level energy of either the host material or the light-emitting dopant material. These are the levels shallower than the HOMO level energy of the host material of the blue light-emitting layer 13B and, therefore, holes passed through the blue light-emitting layer 13B are injected into the red and the green light-emitting layers 13R and 13G easily.

When Formulae (4) and (5) described above are satisfied, the holes passed through the blue light-emitting layer 13B are injected into the red and the green light-emitting layers 13R and 13G easily. Consequently, the effects of suppressing light emission of the blue light-emitting layer 13B and allowing only the red and the green light-emitting layers 13R and 13G to emit light can be exhibited.

Furthermore, in particular, the red and the green organic electroluminescent elements 3R and 3G can have a configuration in which electrons are not injected from the red and the green light-emitting layers 13R and 13G into the blue light-emitting layer 13B easily. For example, it may be the case that each light-emitting layer is configured in such a way as to dispose electron injection barriers between the red and the green light-emitting layers 13R and 13G and the blue light-emitting layer 13B.

According to the above-described configuration, aspects of the present invention can provide a display apparatus, wherein the blue light-emitting organic electroluminescent element exhibits good luminous efficacy without increasing a voltage applied to the organic electroluminescent element even in the case where the blue light-emitting layer 13B is disposed all over the pixel region in order to reduce the usage of the mask for separate coating.

Meanwhile, in the present invention, the term "HOMO" is defined as the highest occupied molecular orbital, and the HOMO level energy thereof was measured by using photoelectron spectroscopy (AC-2, produced by RIKEN KIKI CO., LTD.) in the air. The term "LUMO" is defined as the lowest unoccupied molecular orbital, and the LUMO level energy was calculated by subtracting the band gap, which was determined from an absorption edge of the absorption spectrum measured by using ultraviolet and visible spectroscopy (UV/VIS V-560, produced by JASCO Corporation), from the value of the HOMO level energy measured by the above-described method.

As is indicated by Formulae (1) to (5) described above, the size relationship between the HOMO level energy and the LUMO level energy in each Formula is specified on the absolute value basis.

In the present embodiment, the blue light-emitting layer 13B is mentioned as an example of the common light-emitting layer (first light-emitting layer) and the red light-emitting layer 13R is mentioned as an example of the second light-emitting layer, although not specifically limited to them. As for the common light-emitting layer, another color light-emitting layer, e.g., a green light-emitting layer 13G or a red light-emitting layer 13R, may also be applied.

In the configuration of the present embodiment, the anode 11, the hole transportation layer 12, the light-emitting layer, the electron transportation layer 14, and the cathode 15 are stacked in that order from the substrate 10 side. However, conversely, the cathode 15, the electron transportation layer 14, the light-emitting layer, the hole transportation layer 12, and the anode 11 may be stacked in that order from the substrate 10 side.

The display apparatus according to aspects of the present invention may be a bottom emission type display apparatus in which the light of the organic electroluminescent element is emitted from the substrate 10 side, or be a top emission type display apparatus in which the light of the organic electroluminescent element is emitted from the side opposite to the substrate 10.

The display apparatus according to aspects of the present invention is used in display portions of television systems and personal computers. In addition, the display apparatus may be used in display portions and electronic viewfinders of image pickup apparatuses, e.g., digital cameras and digital video cameras. The image pickup apparatus further includes image pickup elements, e.g., an image pickup optical system and a CMOS sensor, to pick up an image.

The display apparatus according to the present embodiment may be used in a display portion of a cellular phone, a display portion of a hand-held video game machine, and the like and, furthermore, be used in a display portion of a portable music player, a display portion of a personal digital assistant (PDA), and a display portion of a car navigation system.

EXAMPLE

The examples according to aspects of the present invention will be described below. The materials and the element configurations used in the example are no more than examples and the present invention is not limited to them.

A display apparatus having the configuration shown in FIG. 1B and, in addition, the configuration in which an electron injection layer was disposed between the electron transportation layer 14 and the cathode 15 was produced.

A pixel circuit was formed on a glass substrate from a low-temperature polysilicon TFT. An interlayer insulating film made from SiN and a flattening film made from an acrylic resin were formed thereon in that order, so that the substrate 10 shown in FIG. 1B was produced. The anode 11 was formed by stacking silver (film thickness 200 nm) serving as a metal film and IZO (film thickness 20 nm) serving as a transparent electrically conductive layer on the substrate 10, and UV/ozone cleaning was performed.

The above-described substrate provided with the electrode was attached to a vacuum evaporation apparatus (produced by ULVAC, Inc.) and evacuation up to $1.33 \times 10^{-4}$ Pa was performed. Thereafter, a film of N,N'-α-dinaphthylbenzidine having a thickness of 20 nm was formed on the anode 11 without using a mask for separate coating, so as to form a hole transportation layer 12.

A blue light-emitting layer 13B having a thickness of 20 nm was formed by using a pyrene derivative, which is represented by Structural formula (I) described below, as the host material of a blue light-emitting layer 13B and a fluoranthene derivative, which is represented by Structural formula (II) described below, as the light-emitting dopant material. The light-emitting dopant material was contained at a proportion of 2 percent by volume.

Regarding the above-described pyrene derivative, $|LUMO_{H1}|$ was 2.67 eV and $|HOMO_{H1}|$ was 5.61 eV. Regarding the fluoranthene derivative, $|LUMO_{D1}|$ was 3.06 eV and $|HOMO_{D1}|$ was 5.85 eV resulted. Therefore, the relationship represented by Formulae (1) to (3), described above, according to aspects of the present invention was satisfied.

Structural formula (I)

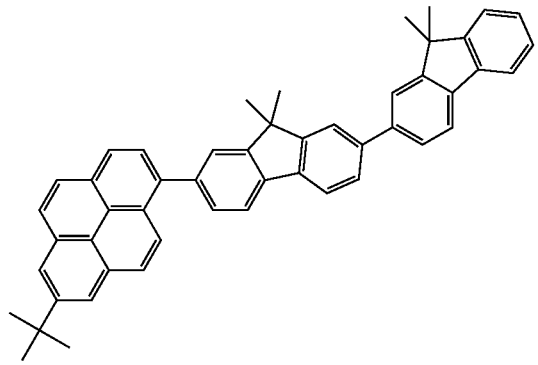

Structural formula (II)

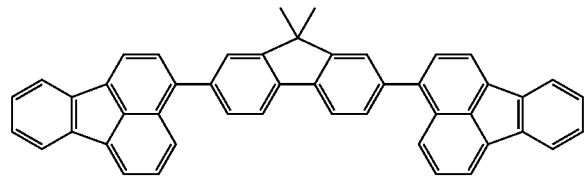

A red light-emitting layer 13R having a thickness of 50 nm was formed only in the region corresponding to the red light-emitting organic electroluminescent element on the blue light-emitting layer 13B by using a metal mask for separate coating. A fluorene derivative represented by Structural formula (III) described below was used as the host material of the red light-emitting layer 13R, an Ir complex represented by Structural formula (IV) described below was used as the light-emitting dopant material, and the light-emitting dopant material was contained at a proportion of 10 percent by volume.

Regarding the above-described Ir complex used as the light-emitting dopant material, |LUMO| was 2.47 eV and |HOMO| was 5.13 eV. Regarding the fluorene derivative used as the host material, |LUMO| was 2.75 eV and |HOMO| was 5.77 eV resulted. That is, $|HOMO_2|$ was 5.13 eV which was the HOMO level energy of the light-emitting dopant material. Therefore, the Ir complex of the light-emitting dopant material and the pyrene derivative used as the host material of the blue light-emitting layer 13B satisfied the relationship represented by Formula (4) according to aspects of the present invention.

A green light-emitting layer 13G having a thickness of 20 nm was formed only in the region corresponding to the green light-emitting organic electroluminescent element on the blue light-emitting layer 13B by using a metal mask for separate coating. A pyrene derivative represented by Structural formula (V) described below was used as the host material of the green light-emitting layer 13G, an arylamine derivative represented by Structural formula (VI) described below was used as the light-emitting dopant material, and the light-emitting dopant material was contained at a proportion of 10 percent by volume.

Regarding the above-described arylamine derivative used as the light-emitting dopant material, |LUMO| was 3.01 eV and |HOMO| was 5.51 eV resulted. Regarding the pyrene derivative used as the host material, |LUMO| was 2.78 eV and |HOMO| was 5.72 eV resulted. That is, $|HOMO_3|$ was 5.51 eV which was the HOMO level energy of the light-emitting dopant material. Therefore, the arylamine derivative serving as the light-emitting dopant material and the pyrene derivative used as the host material of the blue light-emitting layer 13B satisfied the relationship represented by Formula (3) according to aspects of the present invention.

Structural formula (III)

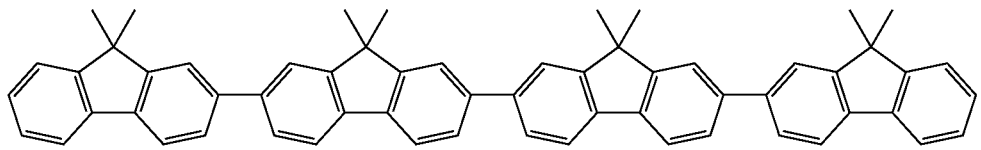

Structural formula (IV)

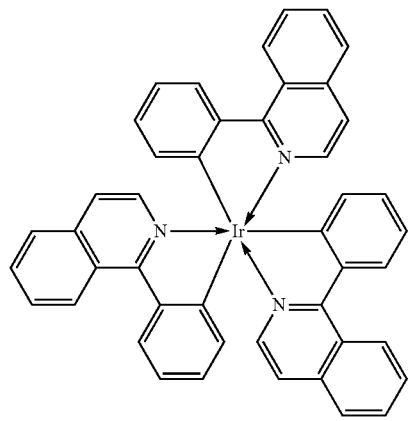

Structural formula (V)

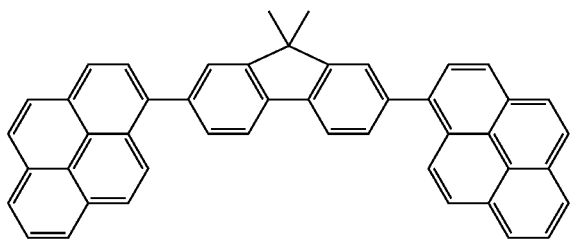

Structural formula (VI)

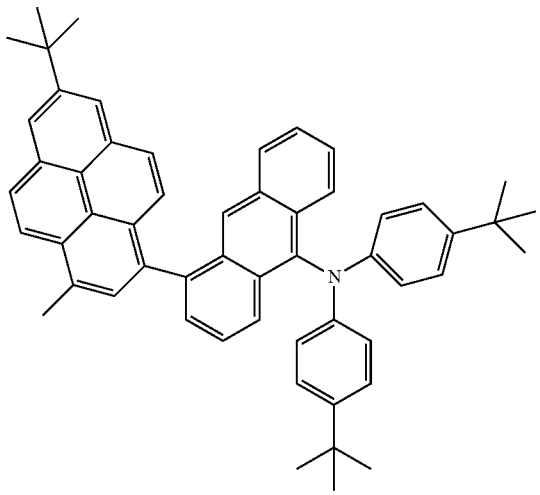

A film of phenanthroline derivative represented by Structural formula (VII), described below, having a film thickness of 10 nm was formed as an electron transportation layer 14. Furthermore, a co-evaporation film having a thickness of 40 nm of cesium carbonate (3 percent by volume) and the above-described phenanthroline derivative was formed as an electron injection layer (not shown in the drawing) on the electron transportation layer 14.

Structural formula (VII)

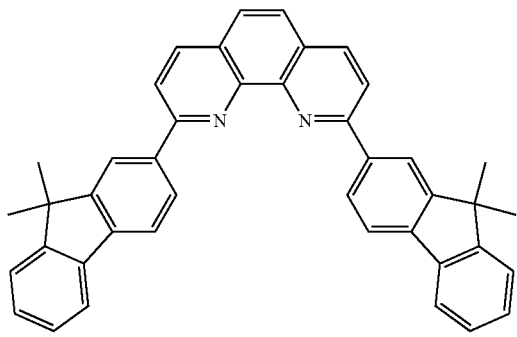

The substrate provided with up to the electron injection layer was conveyed to a sputtering apparatus (produced by ULVAC, Inc.) under vacuum. A film of indium tin oxide having a thickness of 30 nm was formed on the above-described electron injection layer by a sputtering method, so as to form a cathode 15.

The substrate was transferred to a glove box and was sealed with a glass cap (not shown in the drawing) including a desiccant in a nitrogen atmosphere, so that a display apparatus was produced.

The light emission of each color of the display apparatus obtained in the above-described procedure was evaluated. As a result, sufficient light emission of each color was obtained at a low voltage and blue light emission was not observed in red light emission nor in green light emission.

Comparative Example

An arylamine derivative, represented by Structural formula (VIII) described below, serving as a light-emitting dopant material was contained at a proportion of 2 percent by volume in the pyrene derivative used as the host material of the blue light-emitting layer 13B in the above-described example, and the blue light-emitting layer 13B having a thickness of 20 nm was formed. A display apparatus was produced in the same manner as in the above-described example except those described above. In this case, regarding the arylamine derivative concerned, $|LUMO_{D1}|$ was 2.42 eV and $|HOMO_{D1}|$ was 5.29 eV resulted. Therefore, the pyrene derivative and the arylamine derivative did not satisfy the relationship represented by Formula (1), described above, according to aspects of the present invention.

Structural formula (VIII)

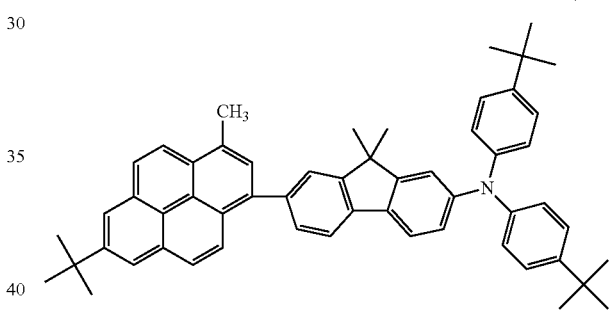

Red and green light emission of the display apparatus in the comparative example was evaluated. As a result, blue light emission was observed and the efficiency of the element was low as compared with the red and green light emission of the display apparatus in the above-described example. The reason for this is believed to be that the display apparatus in the comparative example did not satisfy the relationship represented by Formula (1), described above, according to aspects of the present invention and, therefore, the hole transportation property of the blue light-emitting layer 13B was low and hole injection into the red light-emitting layer 13R and the green light-emitting layer 13G was insufficient.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-188099 filed Aug. 31, 2011, which is hereby incorporated by reference herein in its entirety.

What is claimed is:
1. A display apparatus comprising:
   a first organic electroluminescent element to emit blue color; and a second organic electroluminescent element to emit a second color different from the first color, the both of the first and second organic electroluminescent elements being provided with an anode, a cathode, and a light-emitting layer disposed between the anode and the cathode, wherein a first light-emitting layer of the first organic electroluminescent element and that of the second organic electroluminescent element are in common, a second light-emitting layer of the second organic electroluminescent element is disposed in contact with the first light-emitting layer and in the side nearer to the cathode than is the first light-emitting layer, and further comprising a third organic electroluminescent element to emit a third color different from the first color and the second color, wherein the first light-emitting layer is disposed in common to the third organic electroluminescent element as well, and a third light-emitting layer of the third organic electroluminescent element is disposed in contact with the first light-emitting layer and in the side nearer to the cathode than is the first light-emitting layer;

the first light-emitting layer contains a host material and a light-emitting dopant material and is configured to satisfy Formulae (1) and (2) described below, $$|LUMO_{D1}| > |LUMO_{H1}| \quad (1)$$

$$|LUMO_{D1}| - |LUMO_{H1}| > |HOMO_{H1}| - |HOMO_{D1}| \quad (2)$$

where $LUMO_{H1}$ and $HOMO_{H1}$ represent the LUMO level energy and the HOMO level energy, respectively, of the host material contained in the first light-emitting layer and $LUMO_{D1}$ and $HOMO_{D1}$ represent the LUMO level energy and the HOMO level energy, respectively, of the light-emitting dopant material contained in the first light-emitting layer, wherein the second light-emitting layer is configured to have the HOMO level energy $HOMO_2$ and the $HOMO_{H1}$ satisfying Formula (4) described below, $$|HOMO_2| < |HOMO_{H1}| \quad (4),$$

wherein the third light-emitting layer is configured to have the HOMO level energy $HOMO_3$ and the $HOMO_{H1}$ satisfying Formula (5) described below, $$|HOMO_3| < |HOMO_{H1}| \quad (5).$$

2. The display apparatus according to claim 1, wherein the first light-emitting layer is configured to satisfy Formula (3) described below, $$|HOMO_{D1}| > |HOMO_{H1}| \quad (3).$$

3. The display apparatus according to claim 1, wherein in the second organic electroluminescent element, only the second light-emitting layer emits light.

4. The display apparatus according to claim 1, wherein the dopant material is 10 percent by weight or less in the first light-emitting layer.

5. The display apparatus according to claim 1, wherein in the third organic electroluminescent element, only the third light-emitting layer emits light.

6. The display apparatus according to claim 1, wherein blue light, the second light-emitting layer emits red light, and the third light-emitting layer emits green light.

7. An image pickup apparatus comprising the display apparatus according to claim 1 and an image pickup element.

8. The display apparatus according to claim 1, wherein the first light-emitting layer, the second light-emitting layer and the third light-emitting layer are configured to further satisfy Formula described below, $$|HOMO_{D2}| < |HOMO_{H1}| < |HOMO_{H2}|$$

$$|HOMO_{D3}| < |HOMO_{H1}| < |HOMO_{H3}|$$

wherein $HOMO_{D2}$ represents the HOMO level energy of the dopant material contained in the second light-emitting layer, $HOMO_{H2}$ represents the HOMO level energy of the host material contained in the second light-emitting layer, $HOMO_{D3}$ represents the HOMO level energy of the dopant material contained in the third light-emitting layer and $HOMO_{H3}$ represents the HOMO level energy of the host material of the third light-emitting layer.

9. An apparatus comprising:
a first organic electroluminescent element to emit blue color; and
a second organic electroluminescent element to emit a second color different from the first color,
the both of the first and second organic electroluminescent elements being provided with an anode, a cathode, and a light-emitting layer disposed between the anode and the cathode,
wherein a first light-emitting layer of the first organic electroluminescent element and that of the second organic electroluminescent element are in common,
a second light-emitting layer of the second organic electroluminescent element is disposed in contact with the first light-emitting layer and in the side nearer to the cathode than is the first light-emitting layer, and
further comprising a third organic electroluminescent element to emit a third color different from the first color and the second color,
wherein the first light-emitting layer is disposed in common to the third organic electroluminescent element as well, and
a third light-emitting layer of the third organic electroluminescent element is disposed in contact with the first light-emitting layer and in the side nearer to the cathode than is the first light-emitting layer;
the first light-emitting layer contains a host material and a light-emitting dopant material and is configured to satisfy Formulae (1) and (2) described below, $$|LUMO_{D1}| > |LUMO_{H1}| \quad (1)$$

$$|LUMO_{D1}| - |LUMO_{H1}| > |HOMO_{H1}| - |HOMO_{D1}| \quad (2)$$

wherein $LUMO_{H1}$ and $HOMO_{H1}$ represent the LUMO level energy and the HOMO level energy, respectively, of the host material contained in the first light-emitting layer and $LUMO_{D1}$ and $HOMO_{D1}$ represent the LUMO level energy and the HOMO level energy, respectively, of the light-emitting dopant material contained in the first light-emitting layer,
wherein the second light-emitting layer is configured to have the HOMO level energy $HOMO_2$ and the $HOMO_{H1}$ satisfying Formula (4) described below, $$|HOMO_2| < |HOMO_{H1}| \quad (4),$$

wherein the third light-emitting layer is configured to have the HOMO level energy $HOMO_3$ and the $HOMO_{H1}$ satisfying Formula (5) described below, $$|HOMO_3| < |HOMO_{H1}| \quad (5).$$

* * * * *